United States Patent
Lee

(10) Patent No.: US 7,824,979 B2
(45) Date of Patent: Nov. 2, 2010

(54) SEMICONDUCTOR DEVICE WITH CHANNEL OF FIN STRUCTURE AND METHOD FOR MANUFACTURING THE SAME

(75) Inventor: Jin Yul Lee, Icheon-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 123 days.

(21) Appl. No.: 12/163,926

(22) Filed: Jun. 27, 2008

(65) Prior Publication Data

US 2009/0278183 A1    Nov. 12, 2009

(30) Foreign Application Priority Data

May 6, 2008    (KR) .................. 10-2008-0041745

(51) Int. Cl.
*H01L 21/336*    (2006.01)
(52) U.S. Cl. ............... 438/259; 257/E27.091
(58) Field of Classification Search .......... 438/259; 257/E27.091
See application file for complete search history.

(56) References Cited

U.S. PATENT DOCUMENTS 7,074,662 B2 *  7/2006  Lee et al. .................. 438/199

2005/0170593 A1 *  8/2005  Kang et al. ................. 438/296
2007/0170522 A1 *  7/2007  Lee et al. ................... 257/401
2008/0105900 A1    5/2008  Joshi et al.
2008/0111194 A1    5/2008  Kawakita

FOREIGN PATENT DOCUMENTS

| KR | 10-2004-0059753 | 7/2004 |
| KR | 10-2004-0072267 | 8/2004 |
| KR | 10-2008-0010661 | 1/2008 |
| KR | 10-2008-0029637 | 4/2008 |

* cited by examiner

*Primary Examiner*—Thao P. Le
(74) *Attorney, Agent, or Firm*—Marshall, Gerstein & Borun LLP

(57) ABSTRACT

Provided are a semiconductor device with a channel of a FIN structure and a method for manufacturing the same. In the method, a device isolation layer defining an active region is formed on a semiconductor substrate. A recess trench with a first width is formed in the active region, and a trench with a second width larger than the first width is formed in the device isolation layer. The trench formed in the device isolation layer is filled with a capping layer. A cleaning process is performed on the recess trench to form a bottom protrusion of a FIN structure including a protrusion and a sidewall. Gate stacks filling the recess trench are formed. A landing plug, which is divided by the capping layer filling the trench, is formed between the gate stacks.

27 Claims, 23 Drawing Sheets

SEMICONDUCTOR DEVICE WITH CHANNEL OF FIN STRUCTURE AND METHOD FOR MANUFACTURING THE SAME

CROSS-REFERENCE TO RELATED APPLICATIONS

The present application claims priority to Korean patent application number 10-2008-0041745, filed on May 6, 2008, which is incorporated by reference in its entirety.

BACKGROUND OF THE INVENTION

The present invention relates to a semiconductor device, and more particularly, to a semiconductor device with a channel having a FIN structure and a method for manufacturing the same.

Recently, as the design rule of a semiconductor device rapidly decreases with an increase in the integration level of the semiconductor device, it becomes more difficult to achieve the stable operation of a transistor within the semiconductor device. In particular, as the size of a transistor also decreases with a decrease in the design rule of the semiconductor device to the scale of 50 nm or less, a cell threshold voltage (Vt) and a refresh characteristic margin reach limits. Thus, various researches are being conducted to provide techniques for achieving a larger effective channel length without increasing the design rule. For example, a larger effective channel length is achieved by increasing a channel length for a limited gate linewidth. To this end, an attempt is being made to increase a channel length by means of a FIN-type transistor (FinFET) that uses a transistor including a recess channel and a FIN-type active region. However, in comparison with the pre-existing Double Data Rate (DDR) Dynamic Random Access Memory (DRAM) product, the currently-commercialized high-speed DDR2 DRAM product rapidly decreases a data retention time by setting test conditions at a high temperature. Also, a decrease in the width-direction size of an active region causes degradation in the driving current characteristic of a cell transistor. Degradation in the driving current characteristic of a cell transistor causes a Write Recovery Time (tWR) defect. Achieving a stable cell driving current involves reducing the resistance of a landing plug and a cell junction and further expanding a current path. However, as the width-direction size of an active region decreases, the current path is difficult to expand. Thus, a FIN-type transistor (FinFET) is used to achieve the expanded current path. The FinFET is formed in such a way that a device isolation layer is removed below a recess gate. However, when the subsequent process is performed after removing the device isolation layer below the recess gate, a short is generated between a landing plug and a conductive layer filling a trench formed in the device isolation layer, thus making it difficult to control a self-aligned contact (SAC) defect. An attempt has been made to perform a mask process on the device isolation layer in order to solve the above problem, but it is difficult to apply due to a limitation on patterning. There is therefore a need in the art for techniques to control the self-aligned contact (SAC) defect, which may be generated due to the short between the landing plug and the conductive layer, while achieving the margin of the cell threshold voltage, by simultaneously using the advantages of the FinFET structure and the transistor structure including the recess channel.

SUMMARY OF THE INVENTION

Embodiments of the present invention are directed to a semiconductor device with a channel of a FIN structure and a method for manufacturing the same.

In one embodiment, a method for manufacturing a semiconductor device with a channel of a FIN structure may include: forming a device isolation layer, which defines an active region, on a semiconductor substrate; forming a recess trench with a first width in the active region, and forming a trench with a second width, which is larger than the first width, in the device isolation layer; filling the trench, formed in the device isolation layer, with a capping layer; performing a cleaning process on the recess trench to form a bottom protrusion of a FIN structure including a protrusion and a sidewall; forming gate stacks filling the recess trench; and forming a landing plug, which is divided by the capping layer filling the trench, between the gate stacks.

The forming of the trenches may include: forming a recess trench with a first width in the active region; forming a trench, which has the same width as the recess trench, in the device isolation layer while forming the recess trench; and performing a cleaning process on the trench to increase the width of the trench to a second width larger than the first width. The trench may be formed to be approximately 1.5 to approximately 2 times wider than the recess trench.

The forming of the trenches may include: forming a resist layer on the semiconductor substrate after the forming the device isolation layer; patterning the resist layer to form a resist layer pattern such that a first opening is formed in a region corresponding to the active region and a second opening, which is wider than the first opening, is formed in a region corresponding to the device isolation layer; and forming a recess trench with a first width and a trench with a second trench, which is larger than the first width, by etching the exposed portions of the device isolation layer and the semiconductor substrate using the resist layer pattern as an etch mask.

The filling the trench with the capping layer may include: forming a liner layer on the exposed surfaces of the recess trench and the trench; forming a buffer layer that covers the top of the recess trench while exposing the trench; forming a capping layer on the buffer layer to fill the exposed trench; and etching the capping layer and the buffer layer to expose the active region of the semiconductor substrate.

The liner layer may be formed of a Tetra Ethyl Ortho Silicate (TEOS) layer or a High Thermal Oxide (HTO) layer. The buffer layer may include a Buffer Oxide Undoped Silicate Glass (BO USG) layer and may be formed to a thickness of approximately 300 Å to approximately 500 Å. The capping layer may be formed of a layer that has an etch selectivity with respect to the buffer layer.

The active region of the semiconductor substrate may be exposed by performing an etch-back process or a chemical mechanical polishing (CMP) process on the capping layer and the buffer layer. Herein, the etch-back process may be performed by setting an etch target such that the buffer layer remains to a thickness of approximately 30 Å to approximately 50 Å from the surface of the semiconductor substrate. The landing plug may include a storage node contact plug and a bit line contact plug that extends to a predetermined length from the active region to the device isolation layer in the perpendicular direction.

In another embodiment, a method for manufacturing a semiconductor device with a channel of a FIN structure may include: forming a device isolation layer, which defines an active region, on a semiconductor substrate; forming a recess trench with a first width in the active region and simultaneously forming a trench with a second width, which is larger than the first width, in the device isolation layer; forming a buffer layer that covers the top of the recess trench while exposing the trench; forming a capping layer on the buffer layer to fill the exposed trench; etching the capping layer and the buffer layer to expose the active region of the semiconductor substrate; removing the buffer layer, which remains on the recess trench, to form a bottom protrusion of a FIN structure that is spaced apart by a predetermined distance from the capping layer filling the trench; forming gate stacks filling the recess trench; and forming a landing plug, which is divided by the device isolation layer and the capping layer filling the trench, between the gate stacks.

In still another embodiment, a semiconductor device with a channel of a FIN structure may include: a semiconductor substrate including an active region defined by a device isolation layer; a recess trench having a first width and also being disposed in the active region; a bottom protrusion having a FIN structure including a sidewall and a protrusion disposed on the bottom of the recess trench; a trench having a second width larger than the first width of the recess trench disposed in the device isolation layer; a capping layer filling the trench and also being spaced apart from the bottom protrusion by a predetermined distance; gate stacks filling the recess trench and the bottom protrusion and also crossing in one direction of the semiconductor substrate; and a landing plug disposed between the gate stacks and divided by the capping plug filling the trench.

DESCRIPTION OF SPECIFIC EMBODIMENTS

Figure 1A:
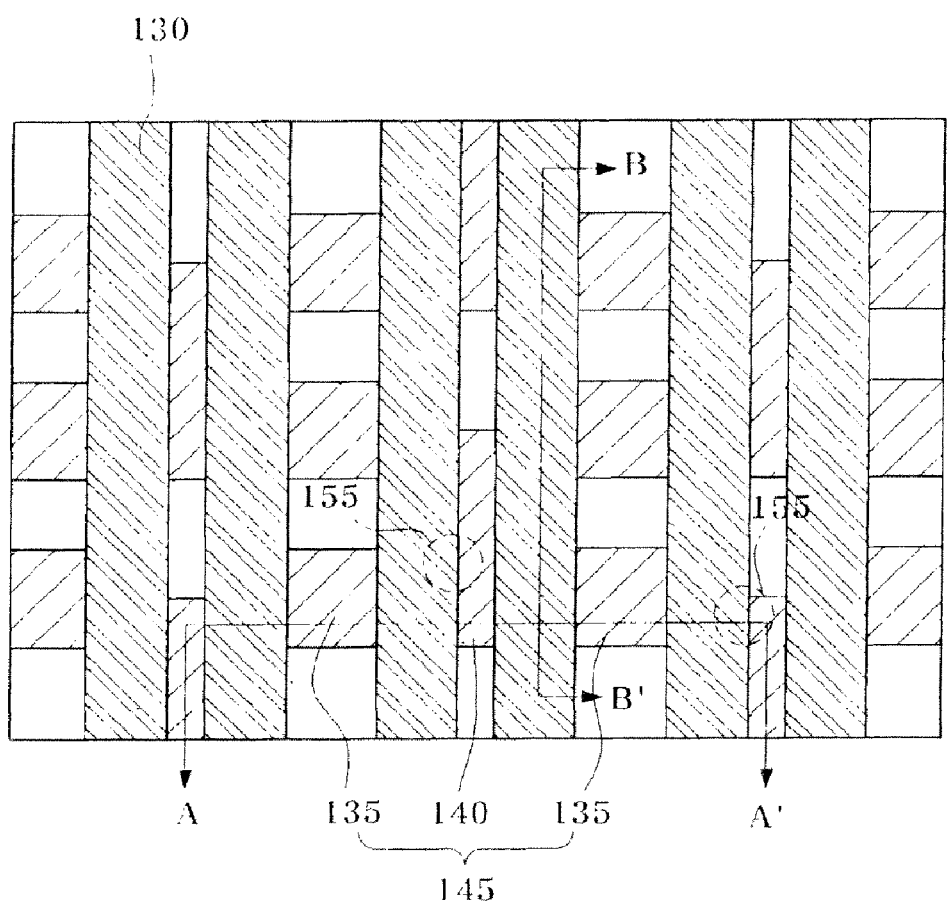
FIGS. 1A to 1C illustrate views of a conventional FinFET.

Hereinafter, a semiconductor device with a channel of a FIN structure and a method for manufacturing the same in accordance with the present invention will be described in detail with reference to the accompanying drawings.

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art. In the drawings, the thicknesses of layers and regions are exaggerated for clarity. Like reference numerals in the drawings denote like elements, and thus their description will be omitted for conciseness.

It will be understood that when an element, such as a layer, a region, or a substrate, is referred to as being "on," "connected to" or "coupled to" another element, it may be directly on, connected or coupled to the other element or intervening elements may be present. In contrast, when an element is referred to as being "directly on," "directly connected to" or "directly coupled to" another element or layer, there are no intervening elements or layers present.

A FIN-type transistor (FinFET) is a type of transistor that uses a transistor including a recess channel and a FIN-type active region. The FinFET is formed in such a way that a device isolation layer is removed below a recess gate. However, there is a case where a self-aligned contact (SAC) defect is induced during the subsequent processes that are performed after the device isolation layer is removed below the recess gate.

Figure 1B:
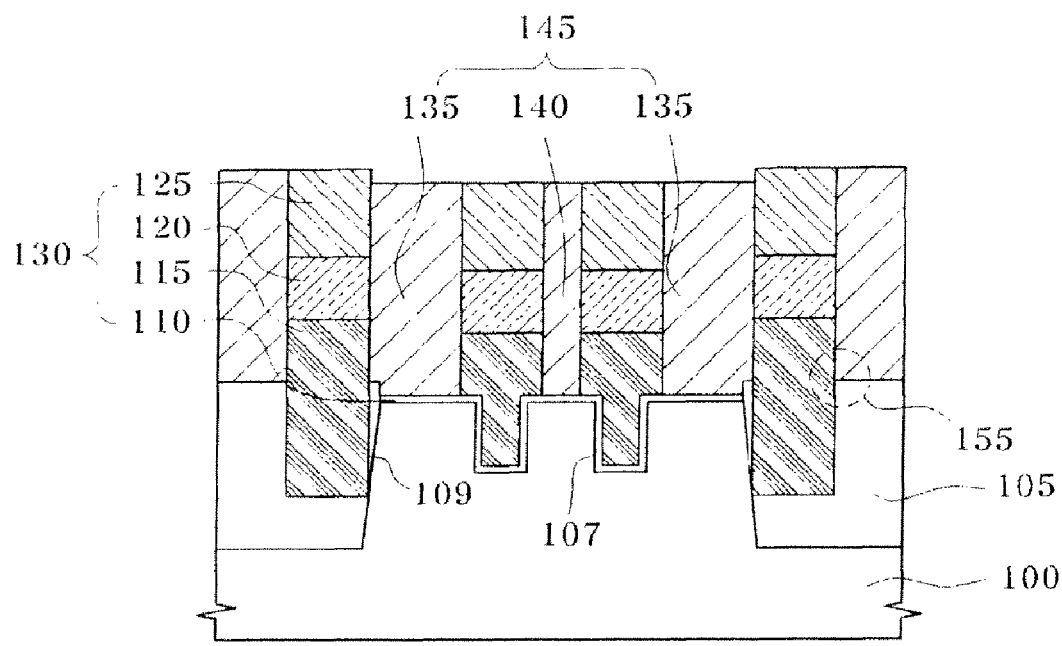
Figure 1C:
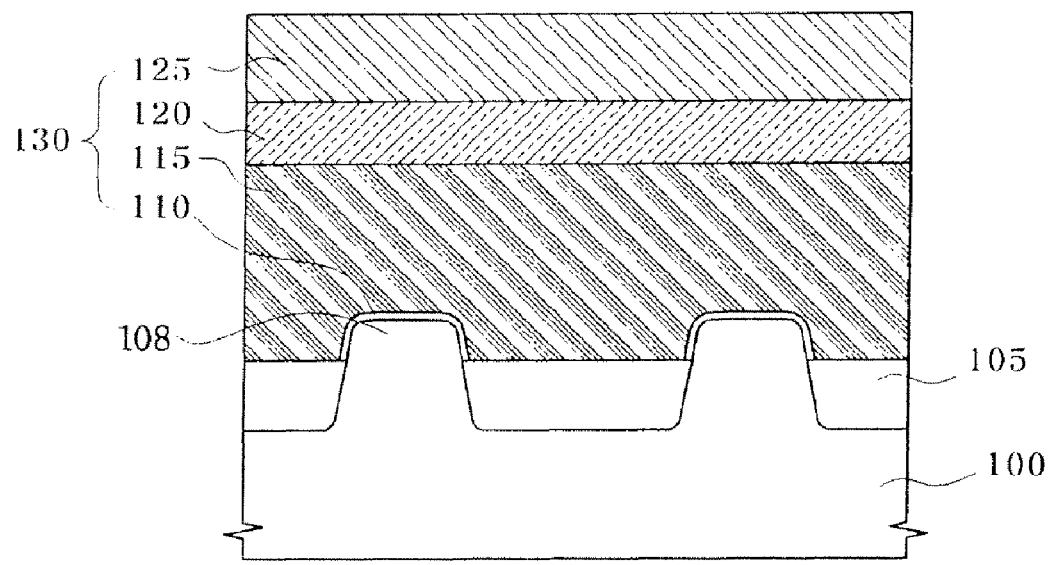

FIGS. 1A to 1C illustrate views of a conventional FinFET. FIGS. 1B and 1C illustrate cross-sectional views taken along lines A-A' and B-B' of FIG. 1A.

Referring to FIGS. 1A to 1C, a device isolation layer 105 defining an active region is formed on a semiconductor substrate 100. A recess trench 107 is formed in the active region of the semiconductor substrate 100, and a trench 109 is formed in the device isolation layer 105. Herein, the trench 109 in the device isolation layer 105 is formed deeper than the recess trench 107 in the active region. Then, as illustrated in FIG. 1C, a portion of the sidewall and the top of the active region are exposed to form a bottom protrusion 108. Also, a gate line 130 is formed to extend across the active region while overlapping the recess trench 107 and the trench 109. The gate line 130 is constructed to include a gate dielectric layer pattern 110, a gate conductive layer pattern 115, a gate metal layer pattern 120, and a hard mask layer pattern 125. The gate line 130 has a FIN structure formed along the exposed surface of the bottom protrusion 108, as illustrated in FIG. 1C. The gate line 130 of the FIN structure causes a current path to expand along the bottom protrusion 108, thus making it possible to achieve the excellent cell driving current characteristics. However, a short is generated between a landing plug 145 and a conductive material filling the trench 109, during the subsequent process (e.g., a process of forming a landing plug 135) that is performed after the forming of the gate line 130 of the FIN structure. Specifically, referring to FIG. 1A, a bit line plug 140 in the middle of the landing plug 145 is formed to extend in the device isolation region direction perpendicular to the active region. Then, the bit line plug 140, which extends to the device isolation region, and the gate conductive layer pattern 115, which fills the trench 109 formed in the device isolation layer 105, are connected and shorted to generate a defect 155. The defect 155 mainly causes the reliability degradation of a semiconductor device. There is therefore a need in the art for techniques to prevent a self-aligned contact (SAC) defect that may be caused by the short between the gate conductive layer pattern 115 and the landing plug 145.

FIGS. 2A to 11c illustrate a method for manufacturing a semiconductor device with a channel of a FIN structure according to one embodiment of the present invention. FIG. 12 illustrates a schematic view of a resist layer pattern used in the present invention.

Figure 2A:
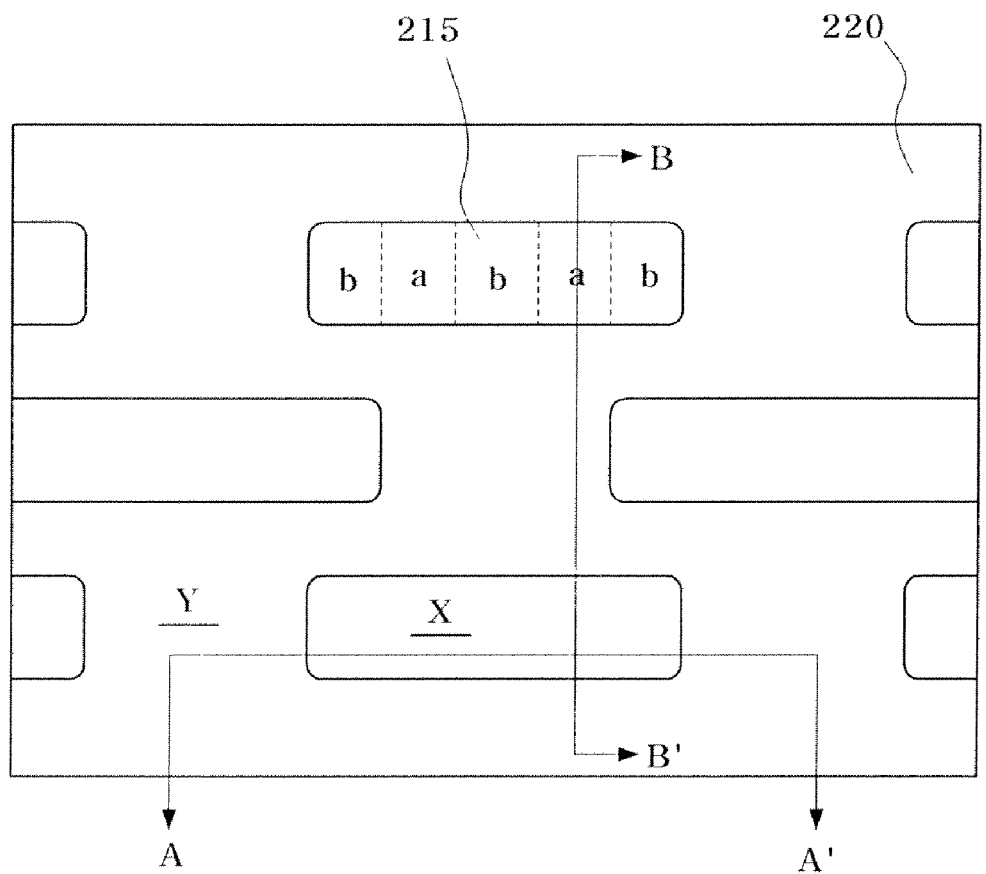
FIGS. 2A to 11C illustrate a method for manufacturing a semiconductor device with a channel of a FIN structure according to one embodiment of the present invention.
Figure 2B:
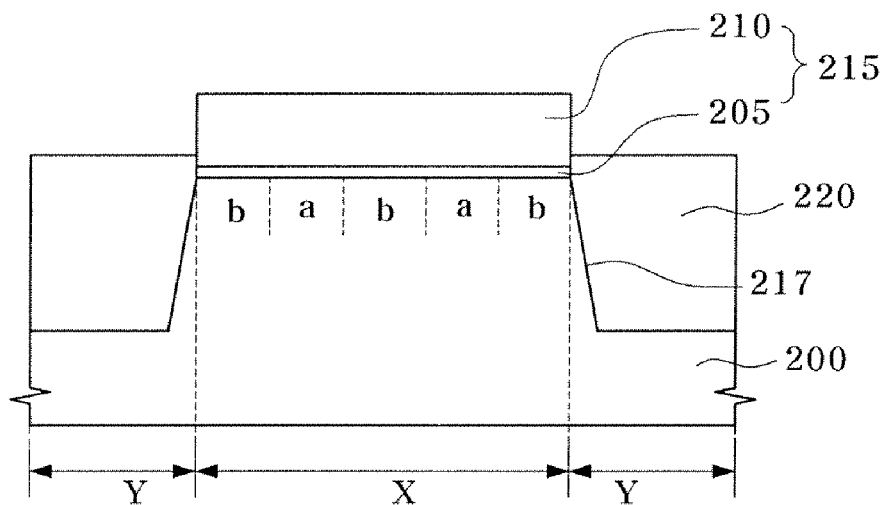
Figure 2C:
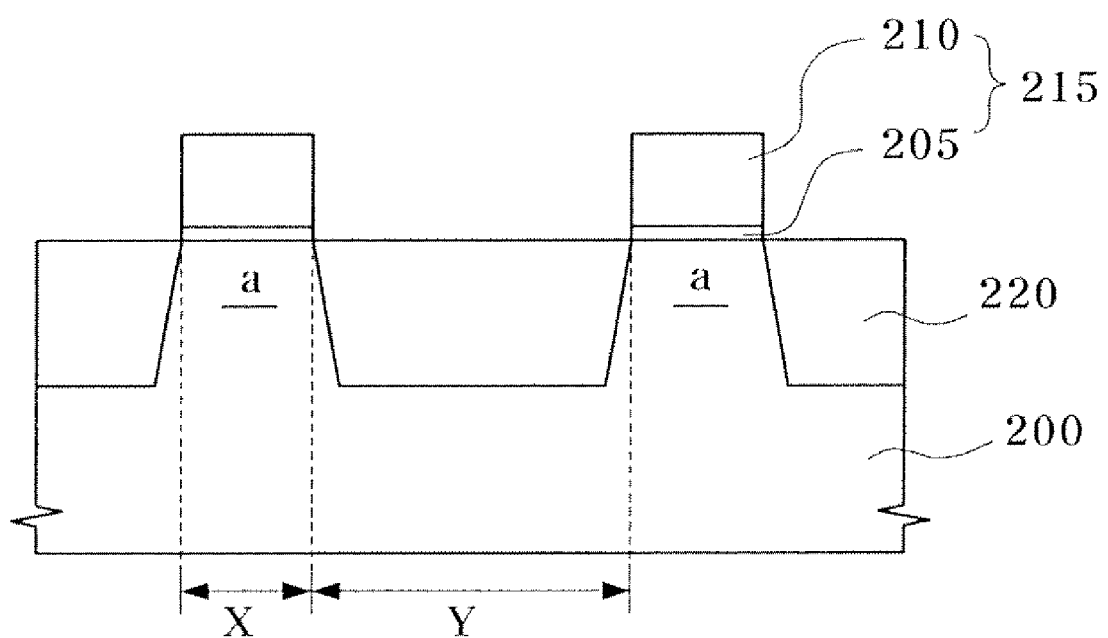

FIGS. 2B and 2C illustrate cross-sectional views taken along lines A-A' and B-B' of FIG. 2A. Referring to FIGS. 2A to 2C, a device isolation layer 220 defining an active region X and a device isolation region Y is formed on a semiconductor substrate 200. First, a mask layer pattern 215, which covers the active region X and selectively exposes the semiconductor substrate 200 of the device isolation region Y, is formed on the semiconductor substrate 200. Herein, the mask layer pattern 215 is formed of a stack of a pad oxide layer pattern 205 and a pad nitride layer pattern 210. For example, the pad oxide layer pattern 205 may be formed to a thickness of approximately 50 Å to approximately 150 Å, and the pad nitride layer pattern 210 may be formed to a thickness of approximately 500 Å to approximately 1000 Å. Thereafter, using the mask layer pattern 215 as an etch mask, the exposed portion of the semiconductor substrate 200 is etched to form a trench 217 in the device isolation region Y. Thereafter, the trench 217 is filled with a dielectric layer, and then a planarization process is performed to form a device isolation layer 220 that defines the active region X and the device isolation region Y. Herein, the active region X is set to include a channel region a, which is to be formed afterward, and a junction region "b" that is to be disposed on each side of the channel region a. The channel region "a" of the active region X is disposed between the junction regions b, and then a gate line is formed to overlap the channel regions a. Thereafter, the mask layer pattern 215 is removed, and a cleaning process is performed to remove the residuals. Although not illustrated in the drawings, a screen oxide layer for a threshold voltage (i.e., a Vt screen), which is to be used as a pad in an ion implantation process for control of the threshold voltage, is formed on the surface of the active region X, and ion implantation is performed on a cell region and a peripheral circuit region.

Figure 3A:
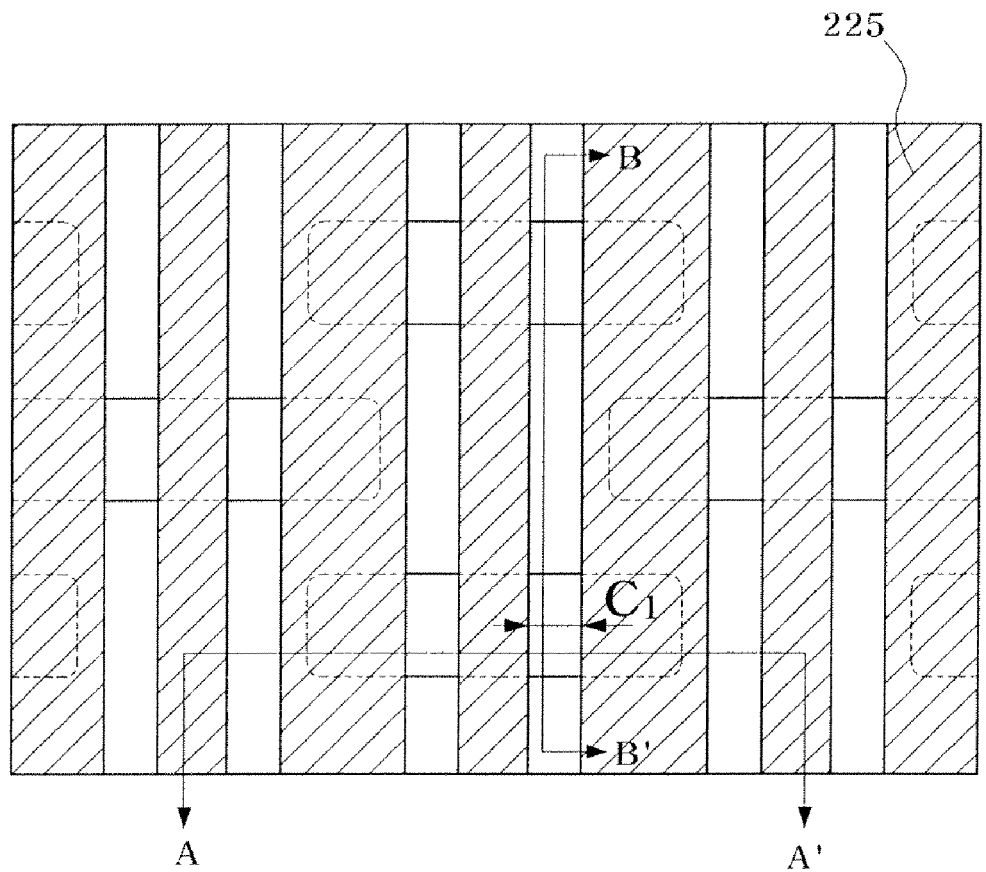
Figure 3B:
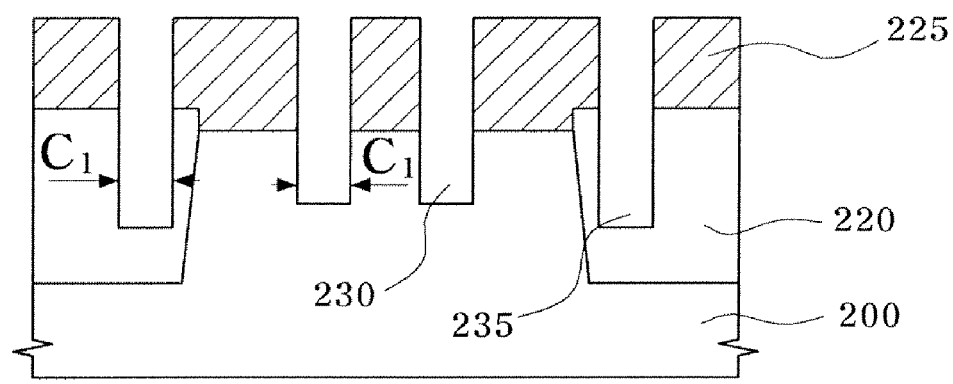
Figure 3C:
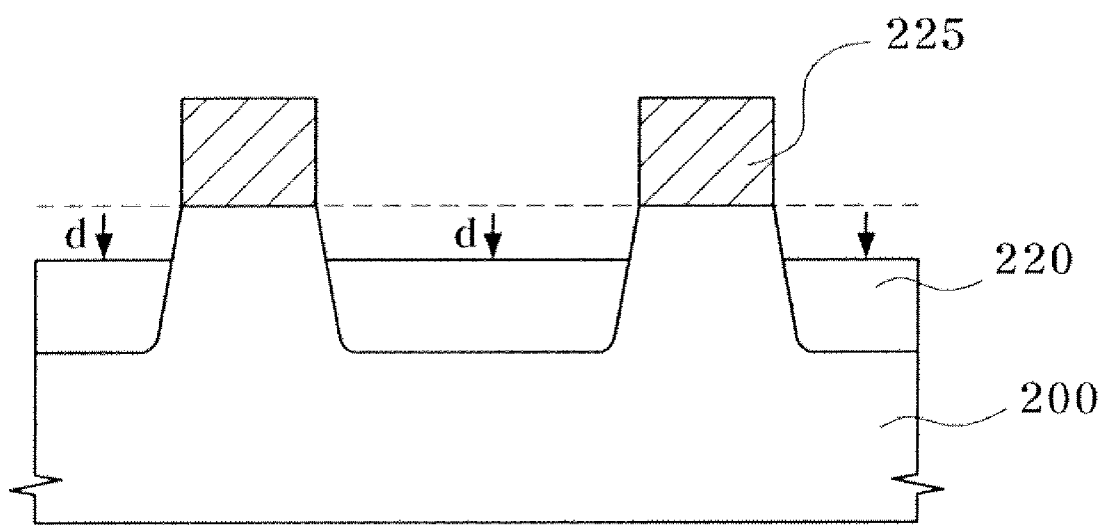

FIGS. 3B and 3C illustrate cross-sectional views taken along lines A-A' and B-B' of FIG. 3A. Referring to FIGS. 3A to 3C, a recess trench 230 is formed in the active region X of the semiconductor substrate 200. Specifically, a hard mask layer is deposited on the semiconductor substrate 200. Herein, the hard mask layer may include an amorphous carbon layer. Thereafter, a resist layer is coated on the hard mask layer, and a photolithography process including an exposure/development process is performed to form a resist layer pattern (not illustrated) that selectively exposes the hard mask layer. Thereafter, using the resist layer pattern as an etch mask, the exposed portion of the hard mask layer is etched to form a hard mask layer pattern 225. The hard mask layer pattern 225 covers the channel region "a" of the active region X and exposes the remaining regions other than the channel region a. Herein, the hard mask layer pattern 225 may be formed in the shape of a line across the junction region "b" while exposing the channel region "a" where a gate line is to be formed afterward. Thereafter, an ashing process is performed to remove the resist layer pattern. Thereafter, using the hard mask layer pattern 225 as an etch mask, an etching process is performed to form the recess trench 230 in the semiconductor substrate 200. Herein, the recess trench 230 is formed in the shape of a line that extends along the channel region "a" and has a first width C1. A trench 235 with a width C1 corresponding to the first width C1 of the recess trench 230 is formed in the device isolation layer 220 during the etching process of forming the recess trench 230 in the active region X of the semiconductor substrate 200. In this case, the trench 235 in the device isolation layer 220 is formed deeper than the recess trench 230. Thereafter, the hard mask layer pattern 225 is removed. Then, the device isolation layer 220 is lowered by a predetermined depth "d" from the exposed surface as illustrated in FIG. 3C, thus partially exposing the sidewall and the top of the semiconductor substrate 200 of the active region X.

Figure 4A:
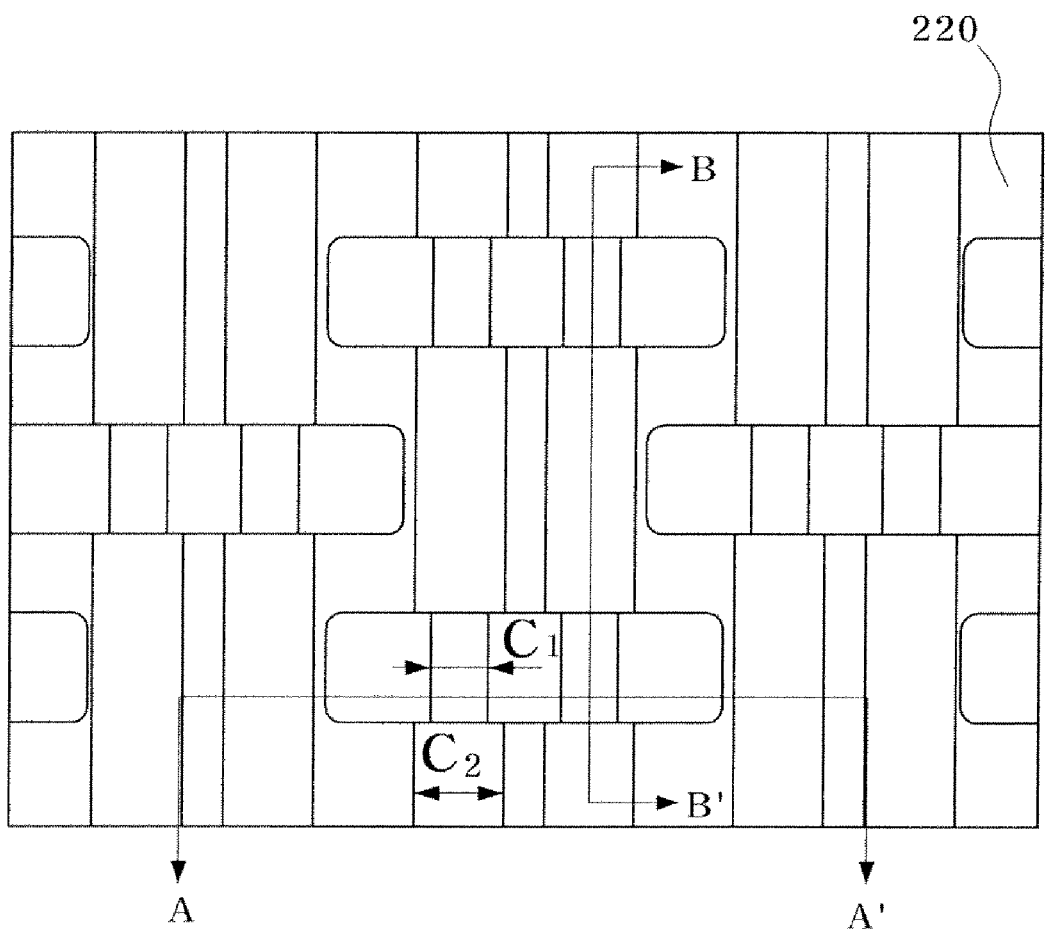
Figure 4B:
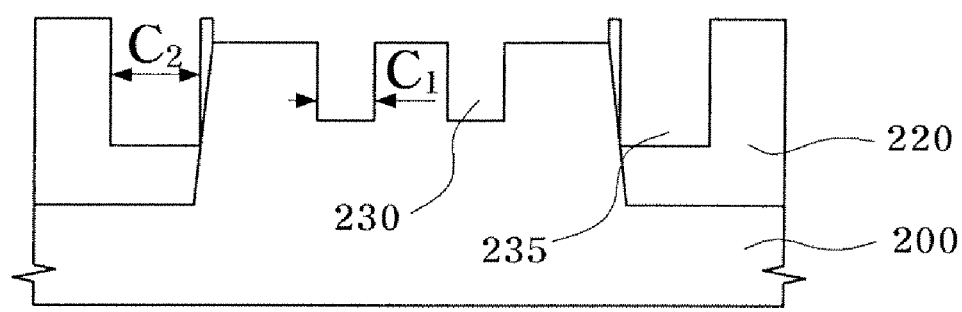
Figure 4C:
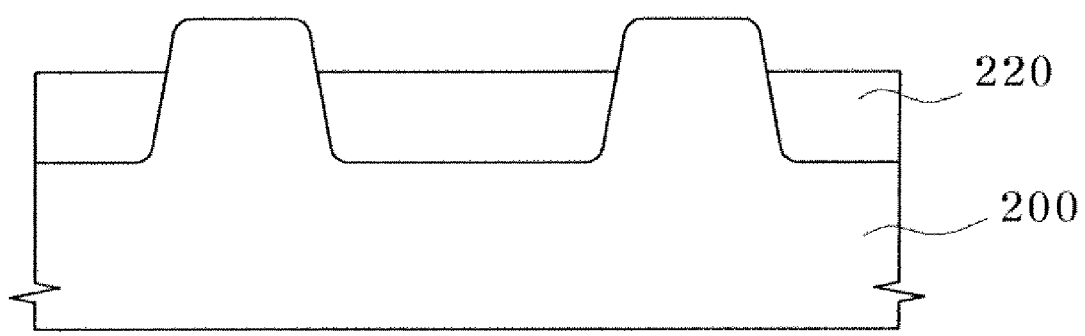

FIGS. 4B and 4C illustrate cross-sectional views taken along lines A-A' and B-B' of FIG. 4A. Referring to FIGS. 4A to 4C, a cleaning process is performed on the device isolation region Y of the semiconductor substrate 200 to increase the width of the trench 235 formed in the device isolation layer 220. Herein, the cleaning process may be a dry cleaning process or a wet cleaning process, and a cleaning source may have the selectivity capable of selectively etching a dielectric layer such as an oxide layer. For example, the cleaning process using the cleaning source may be performed through a dry cleaning process using a mixture of fluoride hydrogen (HF) gas and/or ammonia (NH3) gas, or through a wet cleaning process using fluoride hydrogen (HF) solution. The cleaning process is performed such that the second width C2 of the trench 235 formed in the device isolation layer 220 is approximately 1.5 to approximately 2 times larger than the first width C1 of the recess trench 230 formed in the active region X of the semiconductor substrate 200. Thus, as illustrated in FIG. 4B, it can be seen that the width C1 (see FIG. 3B) of the trench 235 formed in the device isolation layer 220 is increased to a second width C2 (see FIG. 4B) by the cleaning process. Herein, referring to FIG. 4C, the cleaning process does not affect the depth of the device isolation layer 220.

Meanwhile, the recess trench 230 in the active region X, which has the first width C1, and the trench 235 in the device isolation layer 220, which has the second width C2, may be formed using a resist layer pattern 300 illustrated in FIG. 12. Specifically, a device isolation layer 220 is formed on the semiconductor substrate 200, and then a resist layer is formed on the semiconductor substrate 200. Thereafter, the resist layer is patterned to form a resist layer pattern 300 such that a first opening 305 is formed in a region corresponding to an active region X and a second opening 310 wider than the first opening 305 is formed in a region corresponding to a device isolation layer 220 (see FIG. 4B). Thereafter, using the resist layer pattern 300 as an etch mask, the exposed portions of the device isolation layer 220 and the semiconductor substrate 200 are etched to form a recess trench 230 (see FIG. 4B), which has a first width, and a trench 235 (see FIG. 4B), which has a second width larger than the first width of the recess trench 230.

Figure 5A:
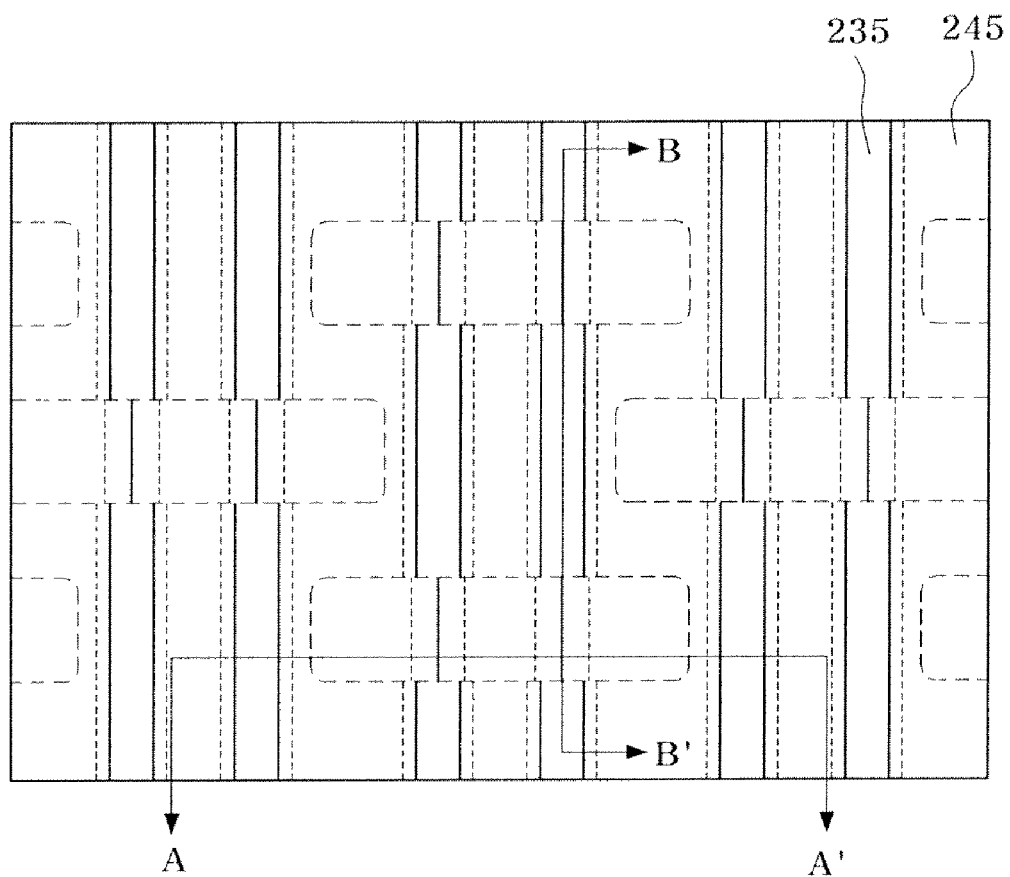
Figure 5B:
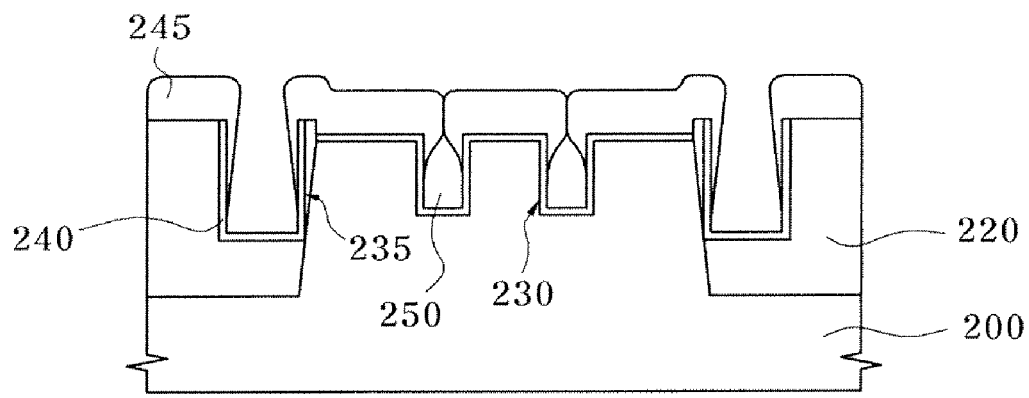
Figure 5C:
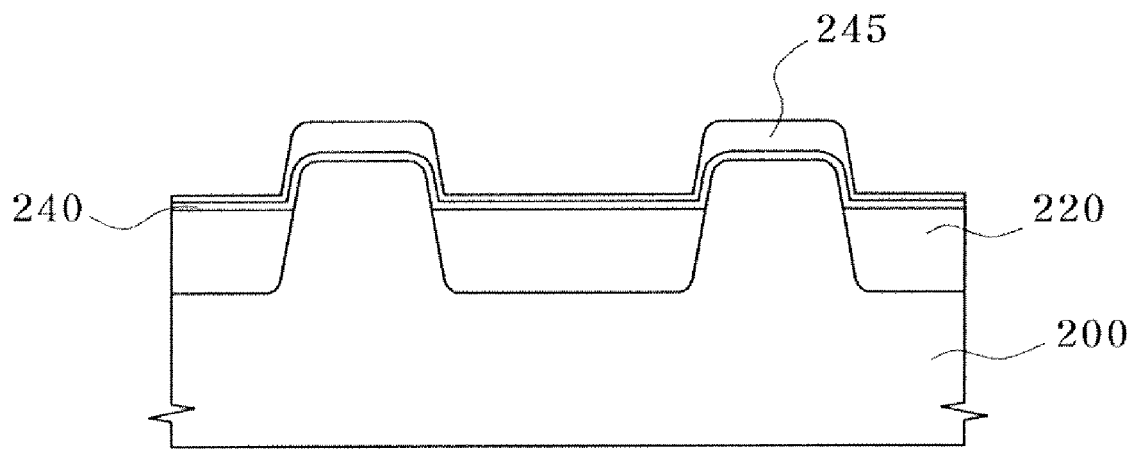

FIGS. 5B and 5C illustrate cross-sectional views taken along lines A-A' and B-B' of FIG. 5A. Referring to FIGS. 5A to 5C, a liner layer 240 is formed on the semiconductor substrate 200. The liner layer 240 may be formed of a dielectric layer (e.g., as an oxide layer) along the exposed surfaces of the recess trench 230 and the trench 235. The oxide layer may be formed to a thickness of approximately 30 Å to approximately 70 Å, including a High Thermal Oxide (HTO) layer or a Tetra Ethyl Ortho Silicate (TEOS) layer with good step-coverage characteristics. Herein, the liner layer 240 is formed on the exposed surfaces of the recess trench 230 and the trench 235 formed in the semiconductor substrate 200, and serves to compensate for the damage generated during the etching process.

Thereafter, a buffer layer 245 is formed on the semiconductor substrate 200 to cover the recess trench 230 and to expose the trench 235 formed in the device isolation layer 220. Specifically, a buffer layer 245 including a material with poor step-coverage characteristics is formed to a thickness of approximately 300 Å to approximately 500 Å on the semiconductor substrate 200. The buffer layer 245 may be formed of a Buffer Oxide Undoped Silicate Glass (BO USG) layer. Because of its poor step-coverage characteristics, the BO USG layer is deposited earlier on the top than on the bottom of the narrow recess trench 230. Accordingly, the BO USG layer completely fills the top of the recess trench 230, failing to completely fill the bottom of the recess trench 230. Thus, a void 250 is generated in the recess trench 230. Herein, the trench 235 of the device isolation region Y is formed wider than the recess trench 230 of the active region X, so that it is possible to prevent the void 250 from being generated in the recess trench 230 because the top of the recess trench 230 is formed earlier than the bottom of the recess trench 230. The buffer layer 245, which covers the recess trench 230 of the active region X while exposing the trench 235 of the device isolation region Y as described above, serves as a barrier that protects the recess trench 230 in the subsequent processes.

Figure 6A:
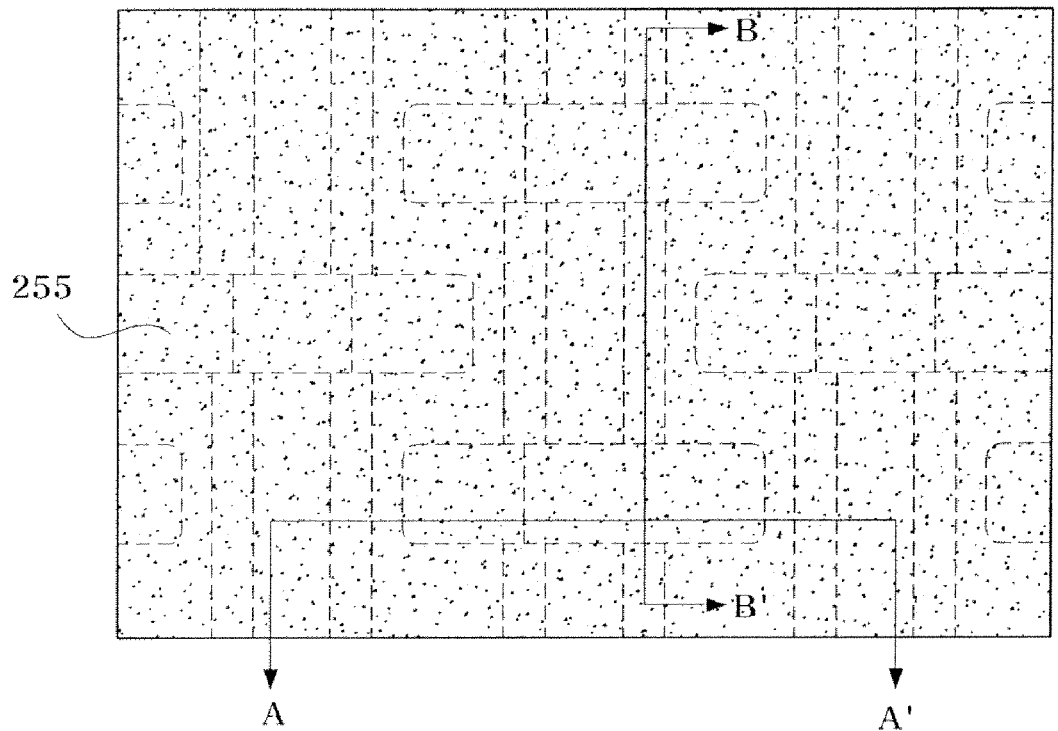
Figure 6B:
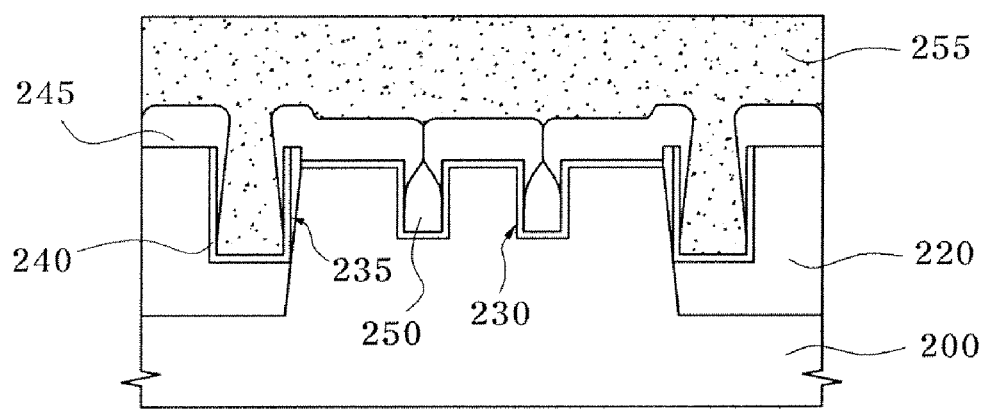
Figure 6C:
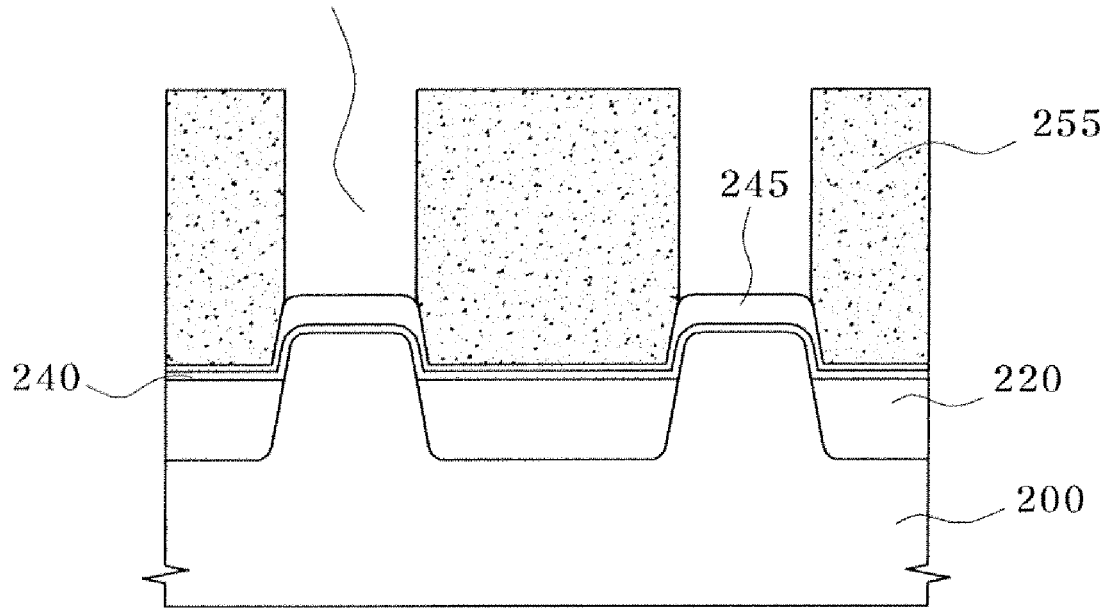

FIGS. 6B and 6C illustrate cross-sectional views taken along lines A-A' and B-B' of FIG. 6A. Referring to FIGS. 6A to 6C, a capping layer 255 is formed on the buffer layer 245. Herein, the capping layer 255 is formed of a layer having an etch selectivity with respect to the buffer layer 245. Also, the capping layer 255 is deposited to such a thickness as to completely fill the exposed trench 235 of the device isolation layer 220. For example, the capping layer 255 may be formed of a nitride layer to a thickness of approximately 200 Å to approximately 500 Å. Herein, as illustrated in FIG. 6C, the capping layer 255 is not deposited on the top of the recess trench 230 that has been covered with the buffer layer 245.

Figure 7A:
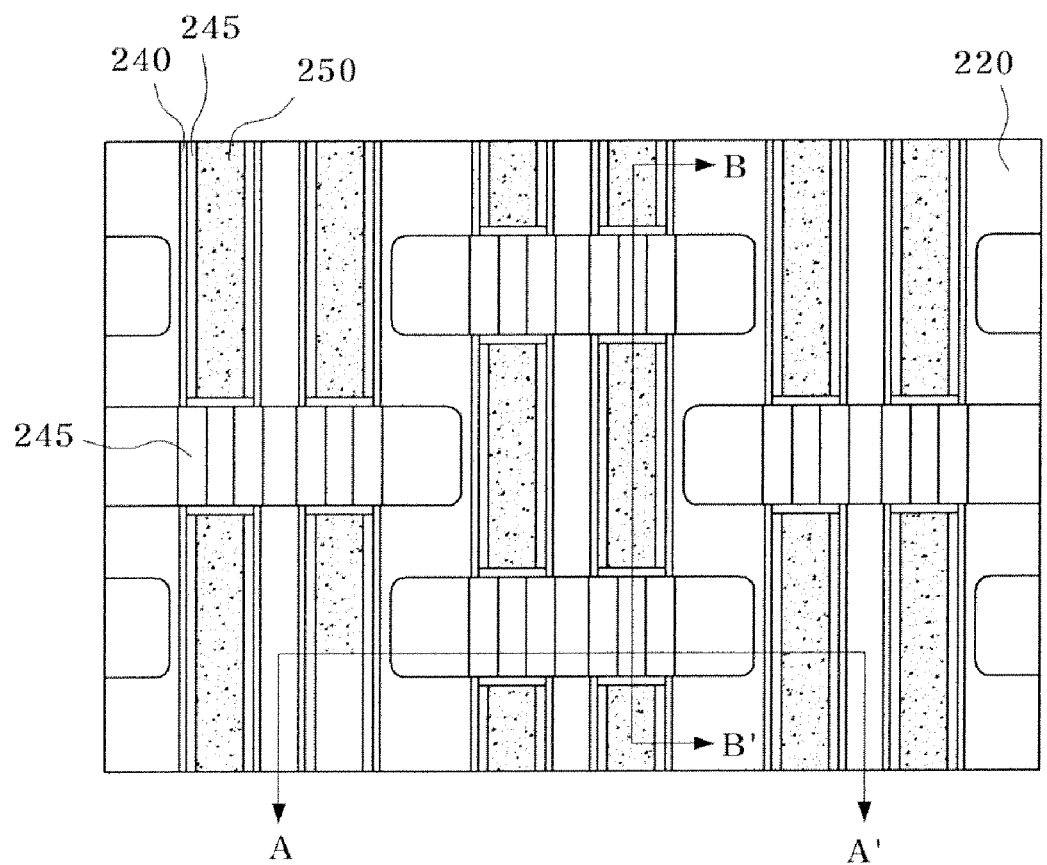
Figure 7B:
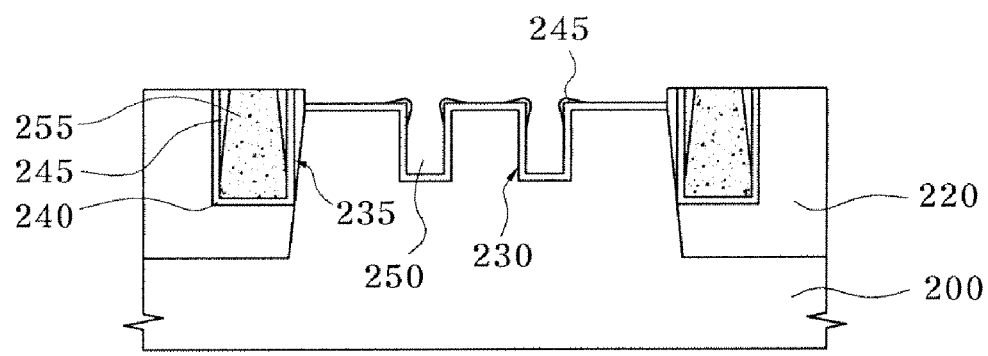
Figure 7C:
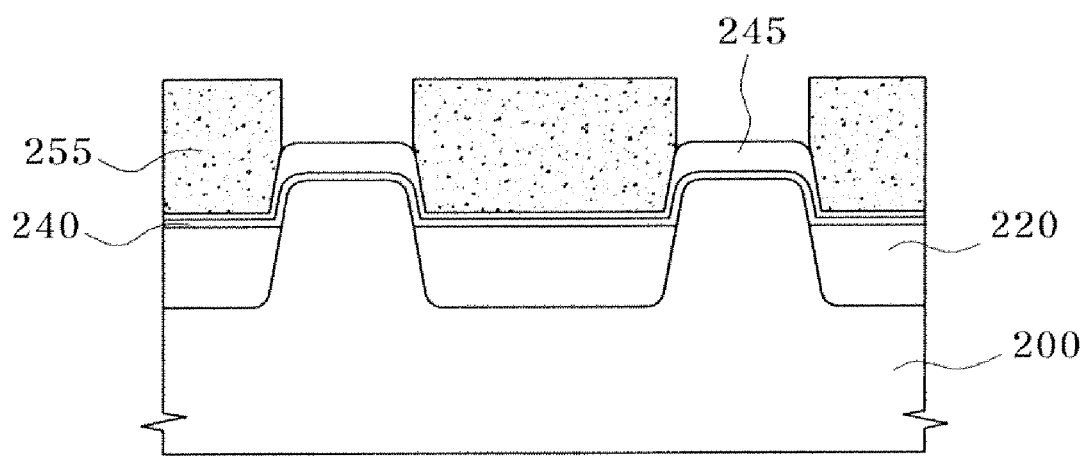

FIGS. 7B and 7C illustrate cross-sectional views taken along lines A-A' and B-B' of FIG. 7A. Referring to FIGS. 7A to 7C, an etch-back process is performed on the semiconductor substrate 200 to expose the active region X. Herein, the etch-back process removes the capping layer 255 of the active region X and simultaneously removes the buffer layer 245 covering the top of the recess trench 230. In this case, when exposed, the semiconductor substrate 200 may be damaged by the etch-back process. Therefore, an etch target of the etch-back process is set so that the buffer layer 245 remains to a thickness of approximately 30 Å to approximately 50 Å from the surface of the semiconductor substrate 200, and that the etching thickness is preferably about 500 Å to about 1000 Å. The performing of the etch-back process etches the capping layer 255 and the buffer layer 245, thus exposing the active region X completely. Thus, the trench 235 formed in the device isolation layer 220 is filled with the liner layer 240, the buffer layer 245 and the capping layer 255, as illustrated in FIG. 7B. Herein, the exposing of the active region X may be performed using a chemical mechanical polishing (CMP) process.

Figure 8A:
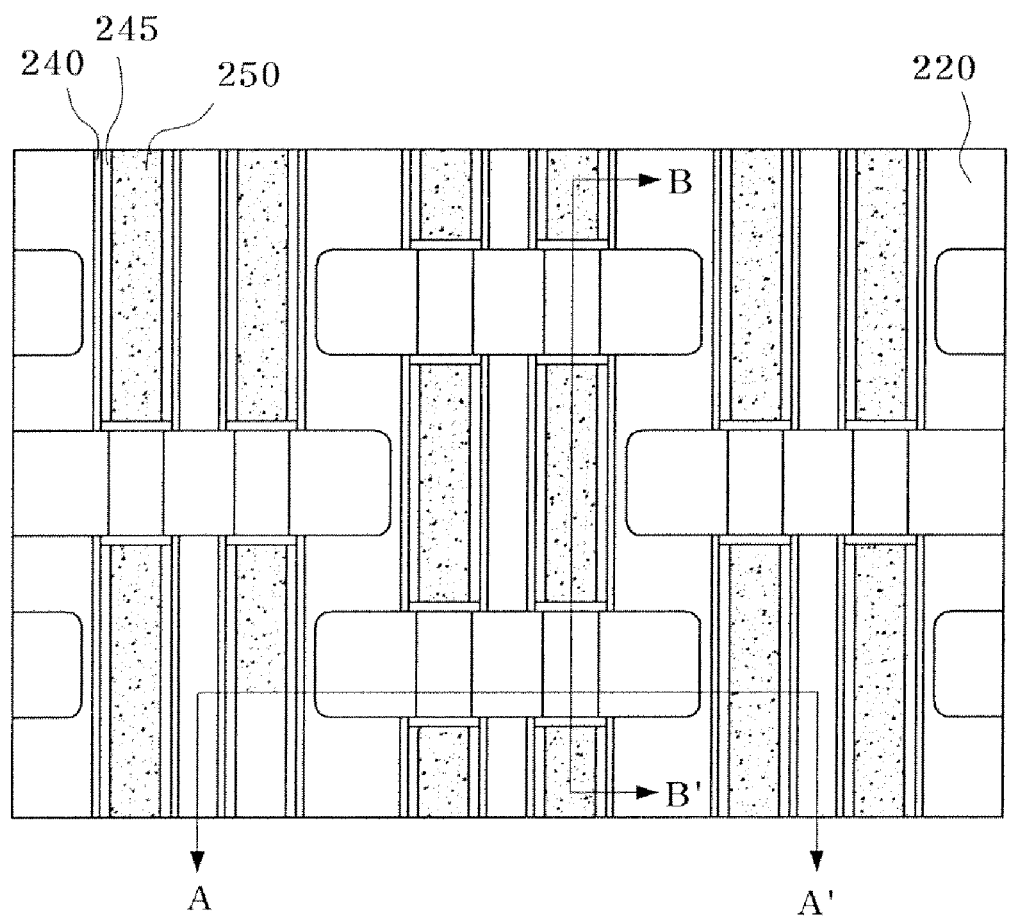
Figure 8B:
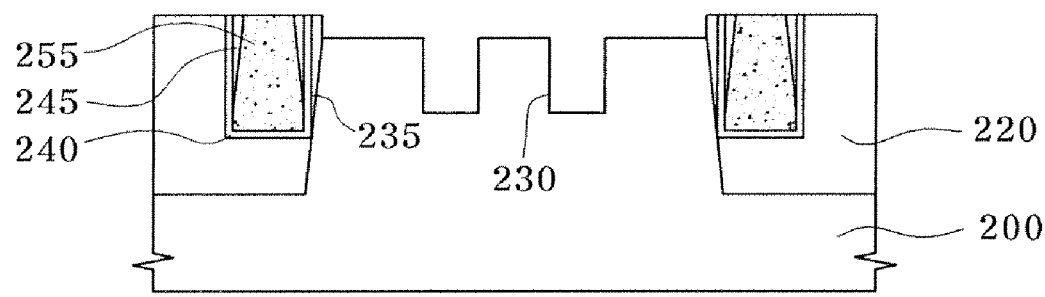
Figure 8C:
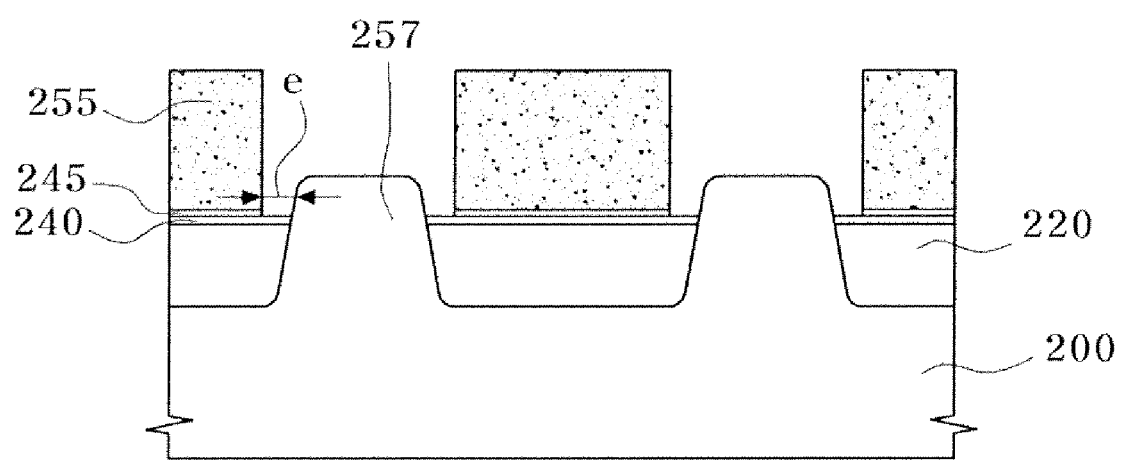

FIGS. 8B and 8C illustrate cross-sectional views taken along lines A-A' and B-B' of FIG. 8A. Referring to FIGS. 8A to 8C, a post-cleaning process is performed to remove the buffer layer 245 that remains on the top, sidewall and bottom of the active region X. As illustrated in FIG. 8C, the performing of the post-cleaning process removes the buffer layer 245 and the liner layer 240 that cover the exposed bottom and sidewall of the semiconductor substrate 200, thus forming a bottom protrusion 257 of a FIN structure. Herein, the bottom protrusion 257 is spaced apart from the adjacent capping layer 255 by a predetermined distance "e". In this case, the height of the bottom protrusion 257 of the FIN structure is determined according to the cleaning level. Therefore, the cleaning conditions (e.g., a cleaning time and the supply amount of the cleaning source) are adjusted to control the profile of the bottom protrusion 257 stably and uniformly. The post-cleaning process may be performed using a dry cleaning process or a wet cleaning process.

Figure 9A:
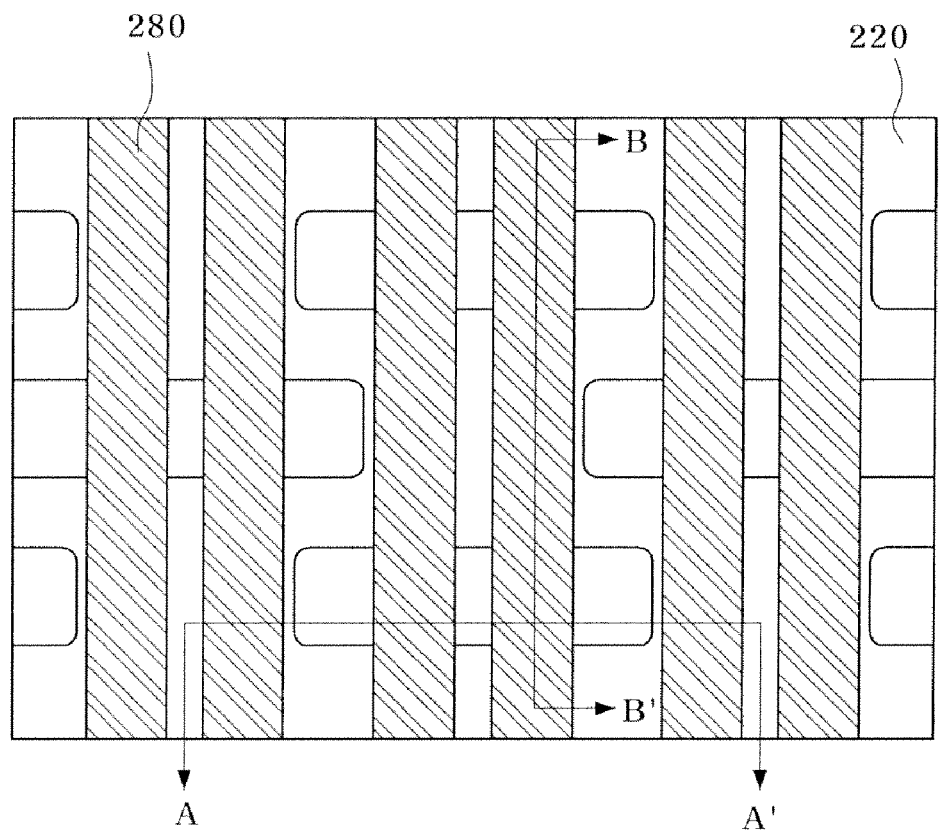
Figure 9B:
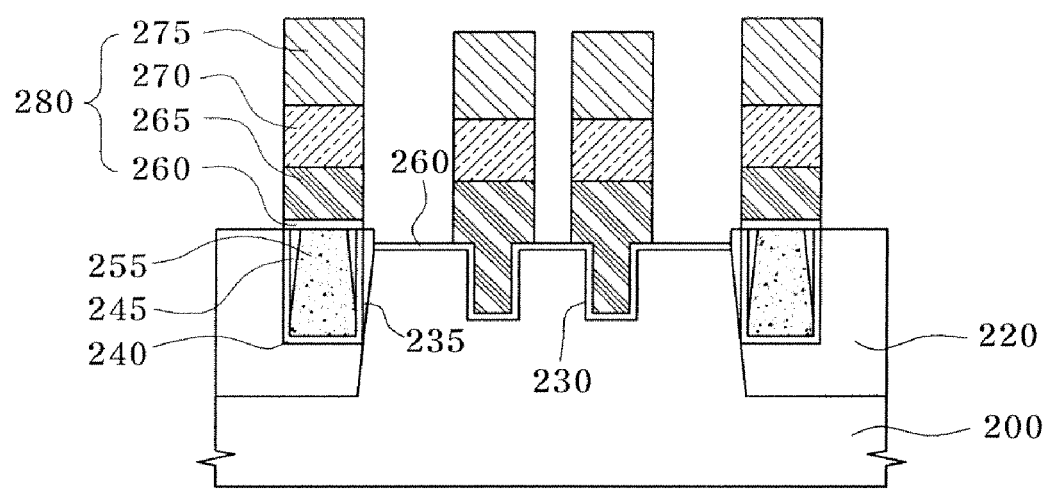
Figure 9C:
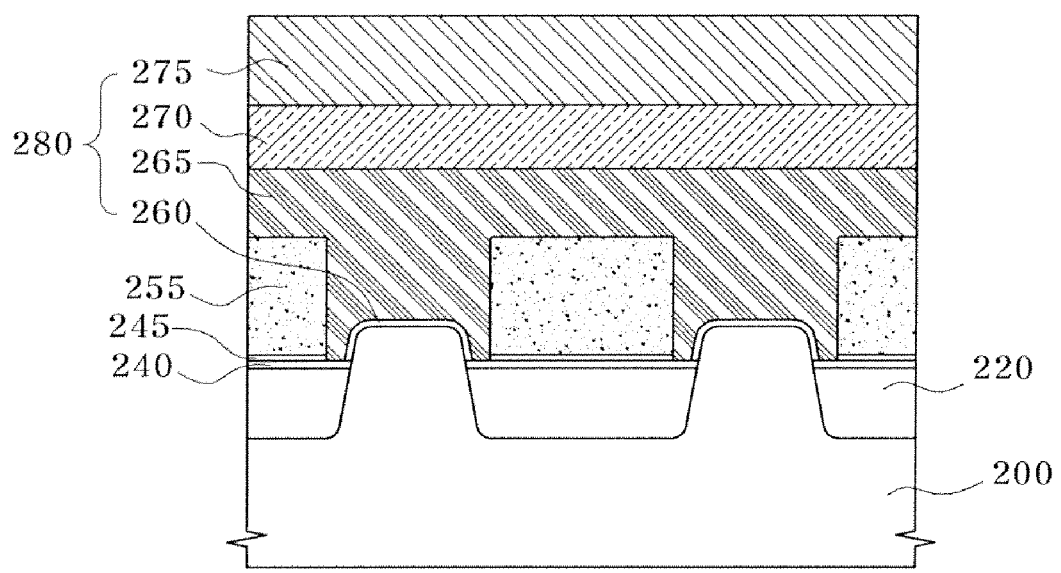

FIGS. 9B and 9C illustrate cross-sectional views taken along lines A-A' and B-B' of FIG. 9A. Referring to FIGS. 9A to 9C, a gate stack 280 is formed to overlap the recess trench 235 with the bottom protrusion 257 of the FIN structure. Specifically, a gate dielectric layer (e.g., an oxide layer) is formed to a thickness of approximately 30 Å to approximately 60 Å on the semiconductor substrate 200. Thereafter, a gate conductive layer (e.g., a doped polysilicon layer) is formed to a thickness of approximately 400 Å to approximately 700 Å on the gate dielectric layer. Thereafter, a gate metal layer (e.g., a tungsten silicide (WSix) layer with a thickness of approximately 1000 Å to approximately 1500 Å or a tungsten (W) layer with a thickness of approximately 400 Å to approximately 500 Å) is formed on the gate conductive layer. Thereafter, a hard mask layer is formed on the gate metal layer. Thereafter, a selective etching process is performed on the resulting structure to form a gate stack 280. The gate stack 280 is formed in a line type as illustrates in FIG. 9A, and includes a gate dielectric layer pattern 260, a gate conductive layer pattern 265, a gate metal layer pattern 270, and a hard mask layer pattern 275 as illustrated in FIGS. 9B and 9C. Thereafter, although not illustrated in the drawings, a spacer layer is formed on the sidewall of the gate stack 280, and then source/drain impurities are implanted to form a source/drain region.

Figure 10A:
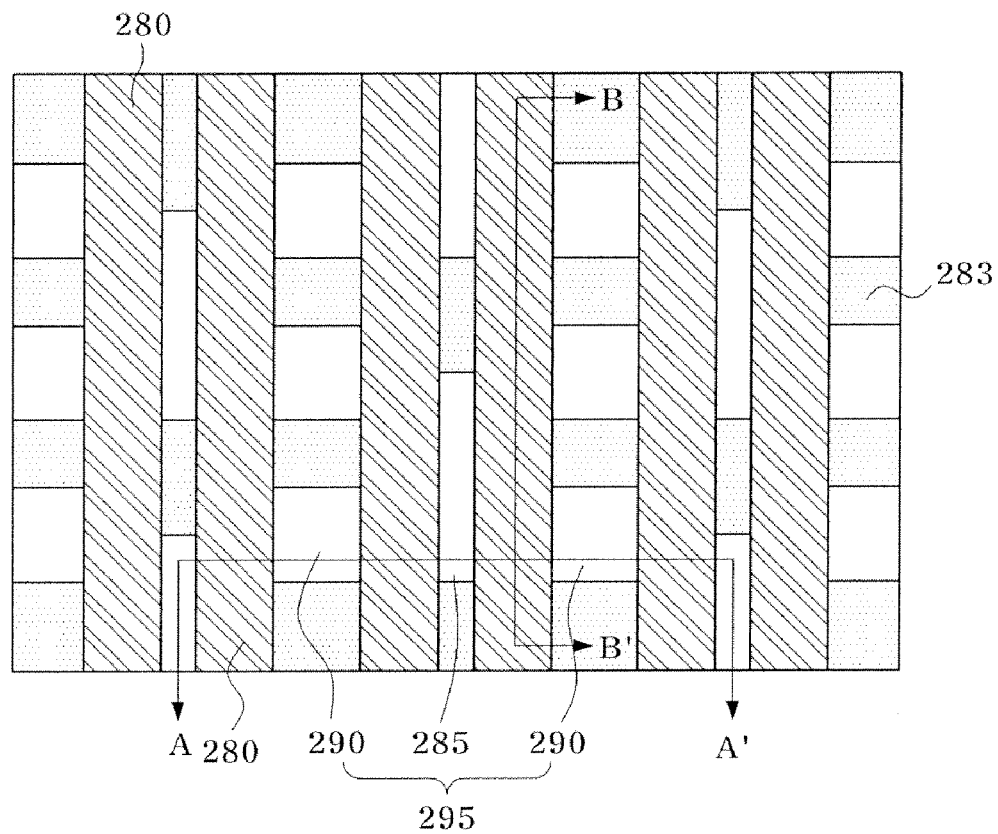
Figure 10B:
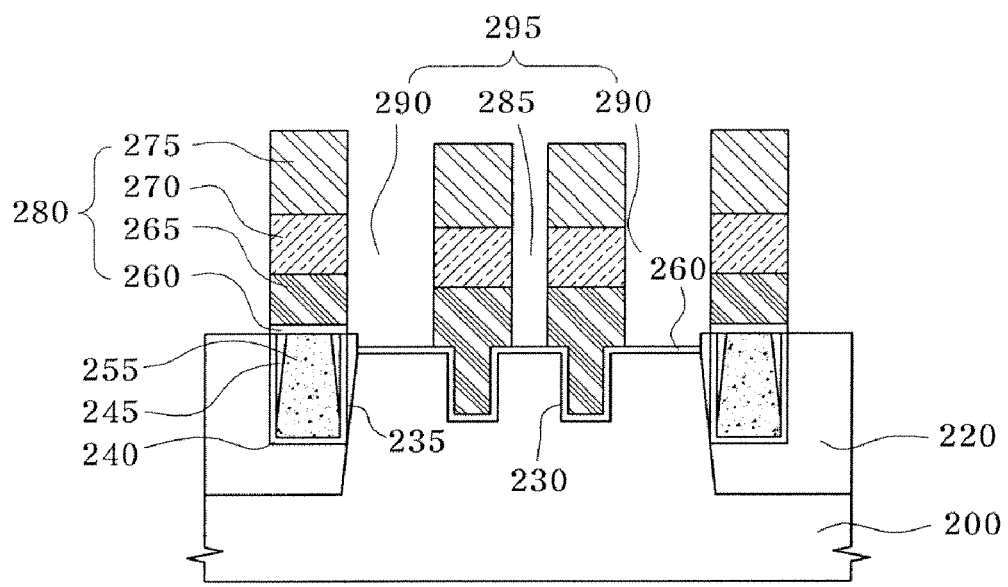
Figure 10C:
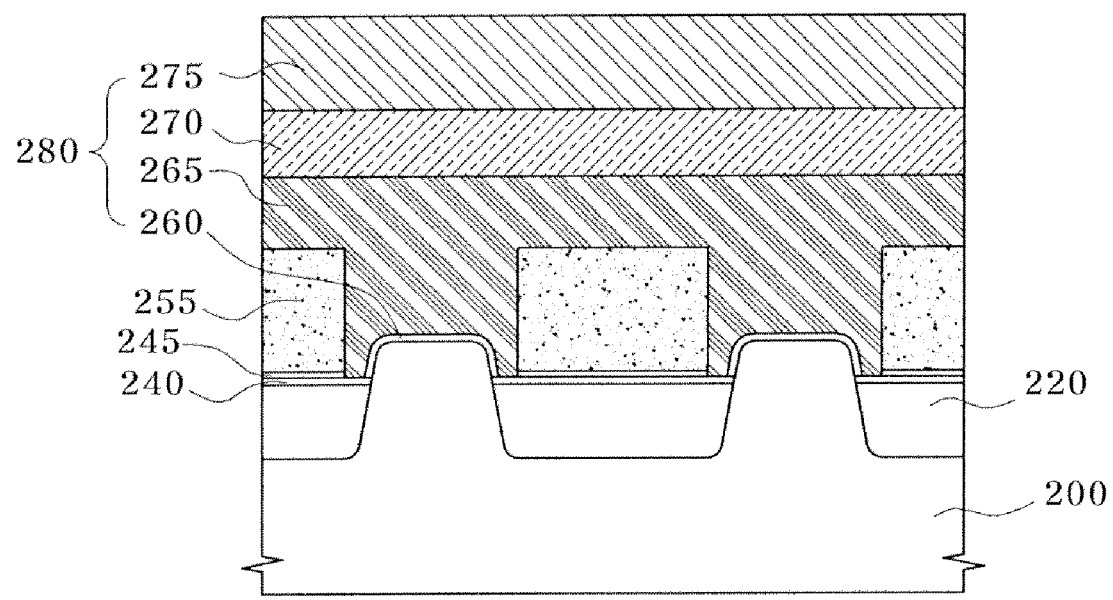

FIGS. 10B and 10C illustrate cross-sectional views taken along lines A-A' and B-B' of FIG. 10A. Referring to FIGS. 10A to 10C, a landing plug contact hole 295, in which a landing plug connecting an upper electrode and a lower electrode is to be formed in the subsequent process, is formed between the gate stacks 280. Specifically, an interlayer dielectric layer 283 is deposited on the entire surface of the semiconductor substrate 200 to completely cover the gate stack 280. Thereafter, a planarization process is performed on the interlayer dielectric layer 283 to expose the hard mask layer pattern 275 of the gate stack 280. The planarization process may be performed using a chemical mechanical polishing (CMP) process. Thereafter, the interlayer dielectric layer 283 between the gate stacks 280 is selectively removed to form a landing plug contact hole 295. The landing plug contact hole 295 includes a storage node contact hole 290, which is to be connected to a storage node, and a bit line contact hole 285 that is to be connected to a bit line. The landing plug contact hole 295 may be set by the adjacent gate stacks 280 using a self-aligned contact (SAC) process. Herein, the bit line contact hole 285 extends to a predetermined length from the active region X to the device isolation region Y as illustrated in FIG. 10A.

Figure 11A:
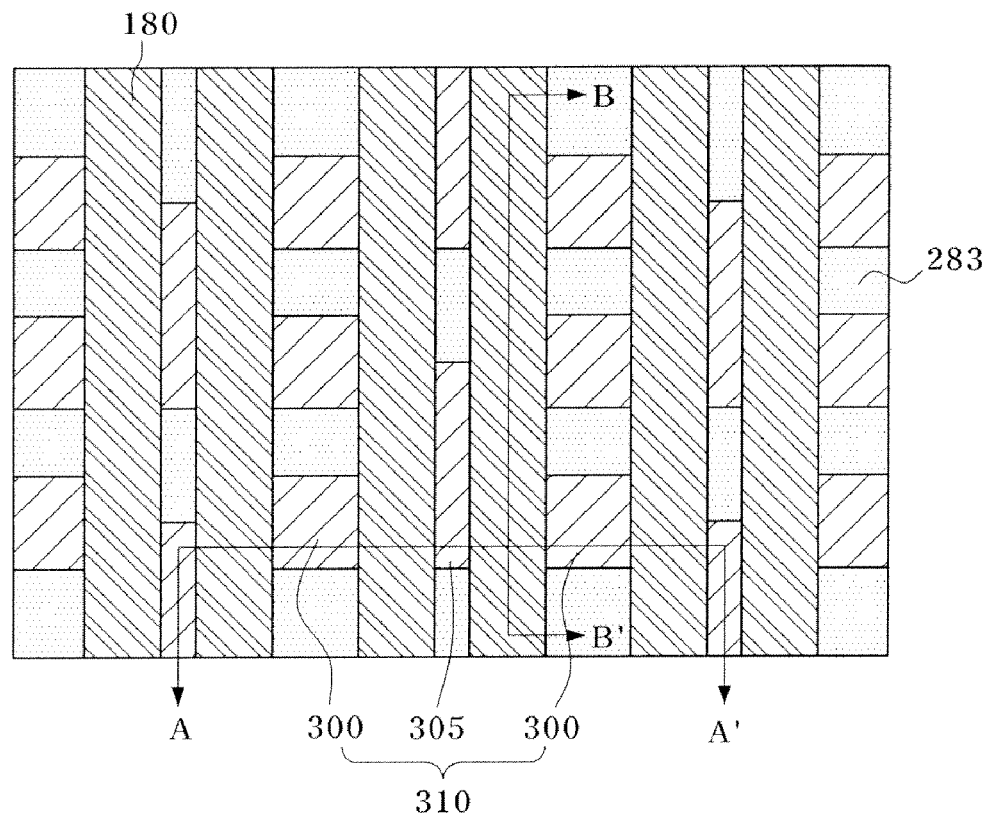
Figure 11B:
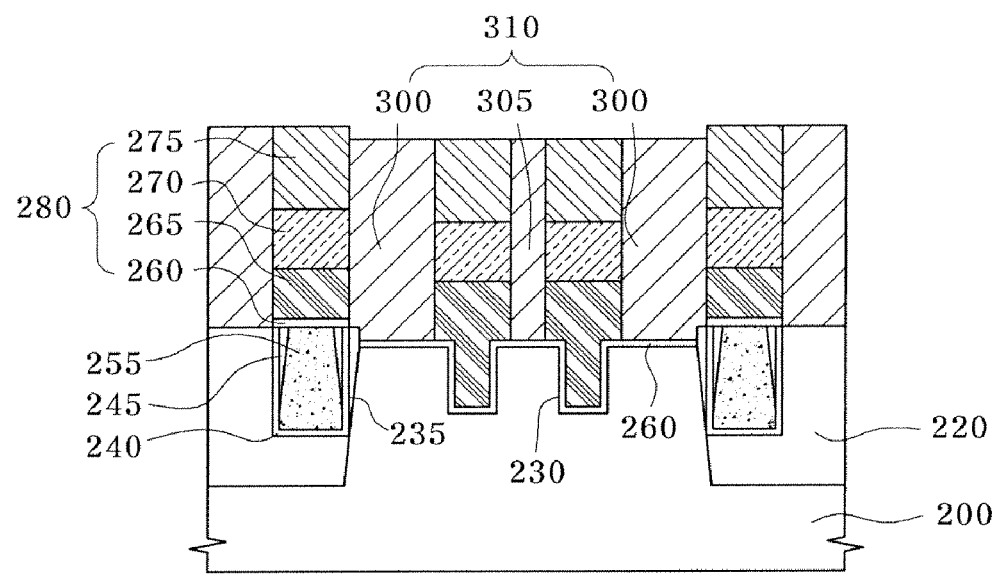
Figure 11C:
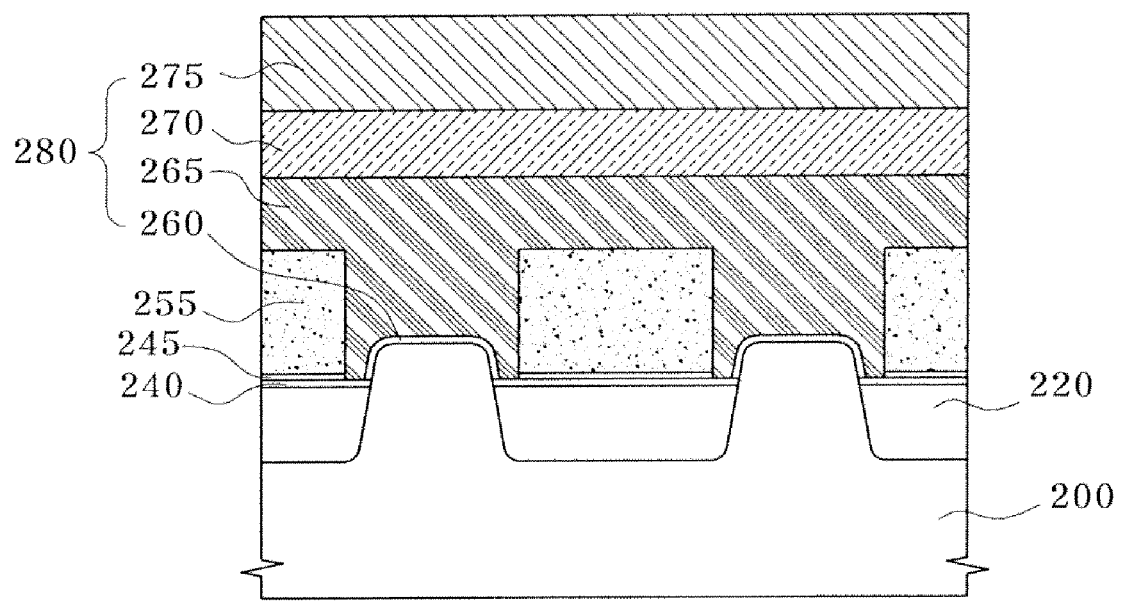
Figure 12:
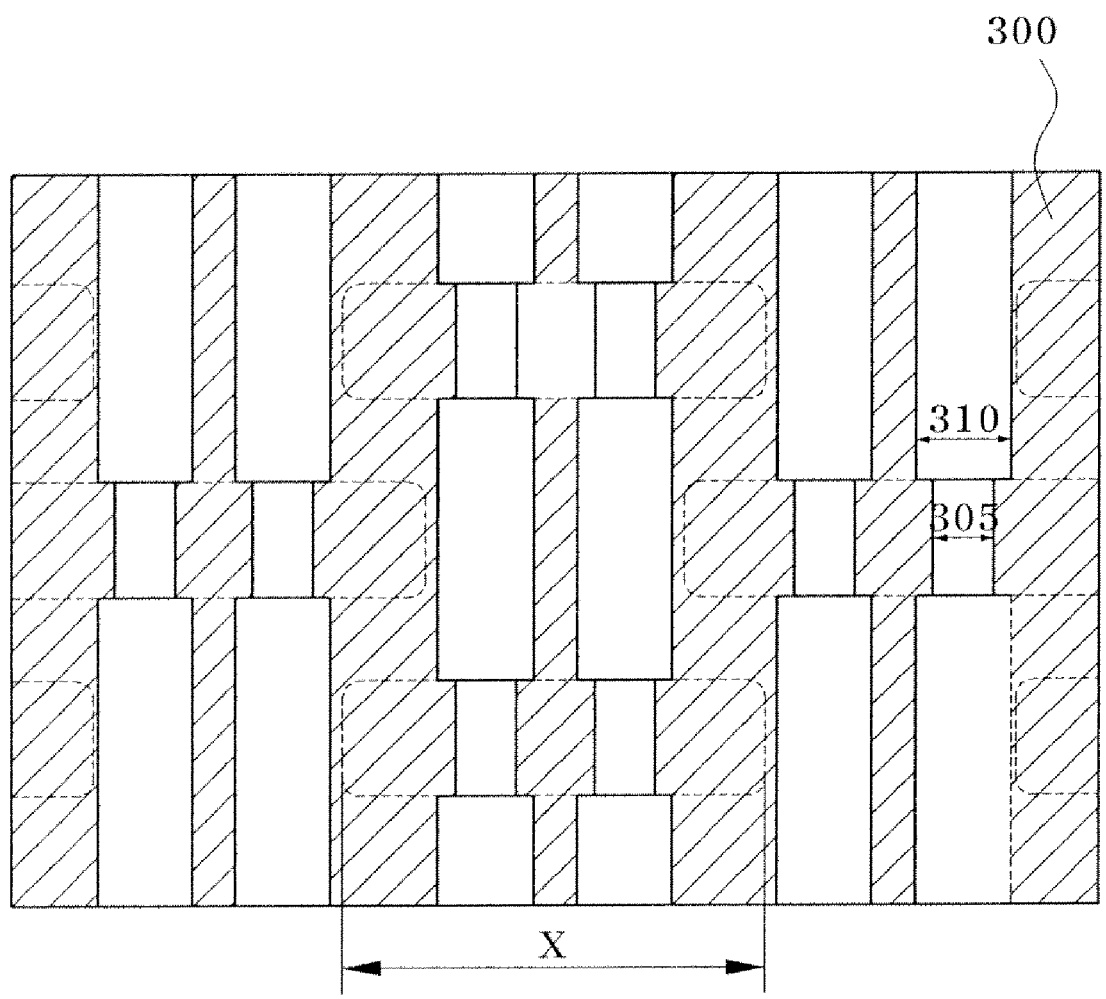
FIG. 12 illustrates a schematic view of a resist layer pattern used in embodiments of the present invention.

FIGS. 11B and 11C illustrate cross-sectional views taken along lines A-A' and B-B' of FIG. 11A. Referring to FIGS. 11A to 11C, a landing plug 310 is formed between the gate stacks 280. Specifically, a conductive layer is deposited on the semiconductor substrate 200 to cover all the exposed surfaces. Herein, the conductive layer may include polysilicon. Thereafter, a polishing process (e.g., an etch-back process or a CMP process) is performed on the conductive layer to the extent that the top of the hard mask layer pattern 275 of the gate stack 280 is exposed, thereby forming a landing plug 310. The landing plug 310 includes a storage node contact plug 300, which is to be connected to a storage node, and a bit line contact plug 305 that is to be connected to a bit line. Herein, the bit line contact plug 305 extends to a predetermined length from the active region X to the device isolation region Y in the perpendicular direction, as illustrated in FIG. 11A. In this case, referring to FIG. 11B, the device isolation layer 220 formed in the device isolation region Y makes it possible to prevent a short that may be generated between the gate conductive layer pattern 265 of the gate stack 280 and the bit line contact plug 305 extending to the device isolation region Y.

As described above, the method for manufacturing the semiconductor device with the channel of the FIN structure forms the recess trench in the active region and locally fills the trench in the device isolation region, thereby making it possible to prevent the SAC defect from being generated. Also, the manufacturing method forms the bottom of the recess trench in the FIN structure, thereby making it possible to provide the stable process margin for the subsequent process while achieving the improved cell driving current characteristics.

While the present invention has been described with respect to the specific embodiments, it will be apparent to those skilled in the art that various changes and modifications may be made without departing from the spirit and scope of the invention as defined in the following claims.

What is claimed is:

1. A method for manufacturing a semiconductor device with a channel having a FIN structure, the method comprising:
   forming a device isolation layer, which defines an active region, on a semiconductor substrate;
   forming a recess trench with a first width in the active region, and forming a trench with a second width, which is larger than the first width, in the device isolation layer;
   filling the trench with a capping layer;
   cleaning the recess trench to form a bottom protrusion of a FIN structure comprising a protrusion and a sidewall;
   forming gate stacks that fill the recess trench and run on the capping layer; and
   forming a landing plug, which is divided by the capping layer filling the trench, between the gate stacks.

2. The method of claim 1, wherein the forming of the trenches comprises:
   forming a recess trench with a first width in the active region;
   forming a trench, which has the same width as the recess trench, in the device isolation layer while forming the recess trench; and
   performing a cleaning process on the trench to increase the width of the trench to a second width larger than the first width.

3. The method of claim 2, wherein cleaning comprises selectively etching an oxide layer, through a dry cleaning process using a mixture of fluoride hydrogen gas and ammonia gas, or through a wet cleaning process using fluoride hydrogen solution.

4. The method of claim 1, wherein the trench is formed to be approximately 1.5 to approximately 2 times wider than the recess trench.

5. The method of claim 1, wherein forming of the trenches comprises:
   forming a resist layer on the semiconductor substrate after the for device isolation layer;
   patterning the resist layer to form a resist layer pattern such that a first opening is formed in a region corresponding to the active region and a second opening, which is wider than the first opening, is formed in a region corresponding to the device isolation layer; and
   forming a recess trench with a first width and a trench with a second trench, which is larger than the first width, by etching the exposed portions of the device isolation layer and the semiconductor substrate using the resist layer pattern as an etch mask.

6. The method of claim 1, wherein filling the trench with the capping layer comprises:
   forming a liner layer on the exposed surfaces of the recess trench and the trench;
   forming a buffer layer that covers the top of the recess trench while exposing the trench;
   forming a capping layer on the buffer layer to fill the exposed trench; and
   etching the capping layer and the buffer layer to expose the active region of the semiconductor substrate.

7. The method or claim 6, wherein the liner layer comprises a Tetra Ethyl Ortho Silicate (TEOS) layer or a High Thermal Oxide (HTO) layer.

8. The method of claim 6, wherein the buffer layer comprises a Buffer Oxide Undoped Silicate Glass (BO USG) layer and is formed to a thickness of approximately 300 Å to approximately 500 Å.

9. The method of claim 6, comprising protecting the recess trench during the exposing of the active region of the semiconductor substrate with the buffer layer.

10. The method of claim 6, wherein the capping layer comprises a layer that has an etch selectivity with respect to the buffer layer.

11. The method of claim 6, comprising exposing the active region of the semiconductor substrate by an etch-hack process or a chemical mechanical polishing (CMP) process on the capping layer and the buffer layer.

12. The method of claim 11, wherein the etch-hack process is performed by setting an etch target such that the buffer layer remains to a thickness of approximately 30 Å to approximately 50 Å from the surface of the semiconductor substrate.

13. The method of claim 1, wherein the landing plug comprises a storage node contact plug and a bit line contact plug that extends to a predetermined length from the active region to the device isolation layer in the perpendicular direction.

14. A method for manufacturing a semiconductor device with a channel of a FIN structure, the method comprising:
   forming a device isolation layer, which defines an active region, on a semiconductor substrate,
   forming a recess trench with a first width in the active region and simultaneously forming a trench with a second width, which is larger than the first width, in the device isolation layer;
   forming a buffer layer that covers the top of the recess trench while exposing the trench;
   forming a capping layer on the buffer layer to fill the exposed trench;
   etching the capping layer and the buffer layer to expose the active region of the semiconductor substrate;
   removing the buffer layer, which remains on the recess trench, to form a bottom protrusion of a FIN structure that is spaced apart by a predetermined distance from the capping layer filling the trench;
   forming gate stacks filling the recess trench; and
   forming a landing plug, which is divided by the device isolation layer and the capping layer filling the trench, between the gate stacks.

15. The method of claim 14, wherein the forming of the trenches comprises:
   forming a recess trench in the active region;
   forming a trench, which has the same width as the recess trench, in the device isolation layer while forming the recess trench; and
   increasing the width of the trench by performing a cleaning process on the trench formed in the device isolation layer.

16. The method of claim 14, comprising cleaning using a cleaning source to selectively etch an oxide layer, through a dry cleaning process using a mixture of fluoride hydrogen gas and ammonia gas, or through a wet cleaning process using fluoride hydrogen solution.

17. The method of claim 14, wherein the trench is formed to be approximately 1.5 to approximately 2 times wider than the recess trench.

18. The method of claim 14, further comprising:
   forming a liner layer on the exposed surfaces of the recess trench and the trench after the forming of the trench.

19. The method of claim 18, wherein the liner layer is formed of a Tetra Ethyl Ortho Silicate (TEOS) layer or a High Thermal Oxide (HTO) layer.

20. The method of claim 14, wherein the buffer layer comprises a Buffer Oxide Undoped Silicate Glass (BO USG) layer and is formed to a thickness of approximately 300 Å to approximately 500 Å.

21. The method of claim 14, comprising protecting the recess trench during the exposing of the active region of the semiconductor substrate with the buffer layer.

22. The method of claim 14, wherein the capping layer is formed of layer that has an etch selectivity with respect to the buffer layer.

23. The method of claim 14, comprising exposing the active region of the semiconductor substrate by performing etch-back process or a chemical mechanical polishing (CMP) process on the capping layer and the buffer layer.

24. The method of claim 23, wherein the etch-back process is performed by setting an etch target such that the buffer layer remains to a thickness of approximately 30 Å to approximately 50 Å from the surface of the semiconductor substrate.

25. The method of claim 14, wherein the bottom protrusion of the FIN structure is formed by performing a post-cleaning process on the recess trench to remove the buffer layer that remains on the top, sidewall and bottom of the recess trench.

26. The method of claim 25, wherein the height of the bottom protrusion is controlled by adjusting a cleaning time of the post-cleaning process or the supply amount of a cleaning source.

27. The method of claim 14, wherein the landing plug comprises a storage node contact plug and a bit line contact plug that extends to a predetermined length from the active region to the device isolation layer in the perpendicular direction.

* * * * *